(12) United States Patent
Cheng et al.

(10) Patent No.: US 11,329,001 B2
(45) Date of Patent: May 10, 2022

(54) EMBEDDED CHIP IDENTIFICATION FORMED BY DIRECTED SELF-ASSEMBLY

(71) Applicant: INTERNATIONAL BUSINESS MACHINES CORPORATION, Armonk, NY (US)

(72) Inventors: Kangguo Cheng, Schenectady, NY (US); Chi-Chun Liu, Altamont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 85 days.

(21) Appl. No.: 16/413,208

(22) Filed: May 15, 2019

(65) Prior Publication Data

US 2020/0365519 A1 Nov. 19, 2020

(51) Int. Cl.
*H01L 23/544* (2006.01)
*H01L 21/02* (2006.01)
*H01L 21/3205* (2006.01)
*H01L 21/311* (2006.01)

(52) U.S. Cl.
CPC ...... *H01L 23/544* (2013.01); *H01L 21/02118* (2013.01); *H01L 21/31138* (2013.01); *H01L 21/32051* (2013.01); *H01L 2223/54433* (2013.01)

(58) Field of Classification Search
None
See application file for complete search history.

(56) References Cited

U.S. PATENT DOCUMENTS

| | | | |
|---|---|---|---|
| 9,330,228 B2 | 5/2016 | Robles et al. | |
| 9,666,451 B2 | 5/2017 | Wallace et al. | |
| 9,917,106 B2 | 3/2018 | Cheng et al. | |
| 9,991,115 B2 | 6/2018 | Pathangi Sriraman | |
| 10,048,212 B2 | 8/2018 | Gronheid et al. | |
| 2017/0125352 A1* | 5/2017 | Vogt | H01L 23/5386 |
| 2018/0096838 A1 | 4/2018 | Dai et al. | |
| 2018/0308806 A1 | 10/2018 | Cheng et al. | |

FOREIGN PATENT DOCUMENTS

EP 3012860 A1 4/2016

OTHER PUBLICATIONS

Lai et al., "Using Directed Self-Assembly to Manufacture Field-Effect Transistor Circuits", SPIE Newsroom, Jun. 2016, pp. 1-3.
Liu et al., "Directed Self-Assembly of Block Copolymers for 7 Nanometre Finfet Technology and Beyond", Nature Electronics, Oct. 2015, pp. 562-569, vol. 1.
Stoykovich et al., "Directed Assembly of Block Copolymer Blends into Nonregular Device-Oriented Structures", Available at: www.sciencemag.org, Aug. 2005, 6 pages.

* cited by examiner

*Primary Examiner* — Alexander G Ghyka
(74) *Attorney, Agent, or Firm* — Tutunjian & Bitetto, PC; Randall Bluestone (57) ABSTRACT

A security region is provided. The security region includes a plurality of parallel conductive lines on a substrate, wherein each of the parallel conductive lines has a width and includes a bend, and wherein at least a portion of the plurality of parallel conductive lines is discontinuous, and an electrically insulating material between each adjacent pair of parallel conductive lines.

19 Claims, 9 Drawing Sheets

EMBEDDED CHIP IDENTIFICATION FORMED BY DIRECTED SELF-ASSEMBLY

BACKGROUND

The present invention generally relates to embedded chip identification, and more particularly to embedded chip identification using sub-lithography patterning.

Unique identifications, as media access control address (MAC address), have been assigned to electronic chips and network interface controllers to specifically identify the chip/device/controller. Such assigned identification values can be a known value assigned to a chip.

SUMMARY

In accordance with an embodiment of the present invention, a security region is provided. The security region includes a plurality of parallel conductive lines on a substrate, wherein each of the parallel conductive lines has a width and includes a bend, and wherein at least a portion of the plurality of parallel conductive lines is discontinuous, and an electrically insulating material between each adjacent pair of parallel conductive lines.

In accordance with another embodiment of the present invention, a security region is provided. The security region includes a plurality of parallel conductive lines on a substrate, wherein each of the parallel conductive lines has a width in a range of about 65 nm to about 80 nm, and includes a bend with an angle in a range of about 60 degrees to about 135 degrees, and wherein at least a portion of the plurality of parallel conductive lines is discontinuous, and an electrically insulating material between each adjacent pair of parallel conductive lines.

In accordance with yet another embodiment of the present invention, a method of forming a security region is provided. The method includes forming a plurality of parallel masking lines on a dielectric layer, wherein the space between adjacent masking lines form guiding trenches. The method further includes forming a block copolymer in each of the guiding trenches, wherein the block copolymer includes at least two components that phase separate into at least two distinct material regions having different chemical properties, and a plug of one of the at least two components forms in a portion of the material region of another of the at least two components, and removing the one of the at least two distinct material regions in which the plugs are formed. The method further includes removing a portion of the dielectric layer exposed by removing the one material region to form a plurality of metallization channels; and forming a conductive material in each of the metallization channels, wherein the plugs cause the conductive material in the metallization channel to be discontinuous.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a unique physical and electronic fingerprint that can be used to generate a random electronic code similar to a media access control address (MAC address) to identify a chip, device, or final product incorporating the chip/device.

Embodiments of the present invention provide a process of generating a unique physical and electronic fingerprint through the random statistical variations in the fabrication process of a security region on a substrate. The statistical variations can produce an unknown arrangement of continuous and discontinuous lines (e.g., polymer or metal) on a substrate. The continuous and discontinuous lines can be continuous and discontinuous conductive lines that can generate logical "0"s and "1"s that provide a randomly encoded electronic value. The continuous and discontinuous lines can also be physically identified by looking at the resulting spatial arrangement of continuous and discontinuous lines through scanning electron microscopes (SEM) or transmission electron microscopes (TEM) to positively ID a chip/device.

Embodiments of the present invention provide a method and structure for forming a unique chip identification taking advantage of patterning-dependency of directed self-assembly (DSA). The DSA is a viable process technique for forming sub-lithography scale patterning, where the DSA utilizes block copolymer (BCP) compounds that can phase separate into distinct regions or domains. A block copolymer is polymer molecule including at least two different monomer species, e.g., a and b, where each of the chemical species is in a separate region of the polymer, e.g., A or B coupled together by a chemical link, for example, A-B in a di-block copolymer or A-B-A in a tri-block copolymer. The block copolymer can separate into different phases, but the link can inhibit macroscopic phase separation. The blocks can arrange themselves in a regular manner that can lead to different structures, for example, lamellae, where the sizes of the A and B blocks are about equal. The DSA performance can have a dependency on the BCP material characteristics (e.g., block sizes, overall polymer chain length, monomer types, etc.) and the geometry of the guiding patterns (e.g., topographical, chemical/surface contrast) used to direct the placement and/or contain the block copolymer compounds, including bends and line widths. The ratio of the block sizes of the BCP to the sizes of the patterned regions can determine the percentage of defects formed due to the mismatch of in sizes.

Embodiments of the present invention provide a structure including a plurality of conductive lines sufficient to provide sufficient variable continuous and discontinuous lines to generate non-duplicative electronic fingerprint patterns and digital logic values, while providing a large enough value to avoid brute force attempts to guess or duplicate the electronic fingerprint value, for example, 128 or more (e.g., 256, 512, 1024, 2048, etc.) continuous and discontinuous conductive lines.

Exemplary applications/uses to which the present invention can be applied include, but are not limited to: chips/device for the Internet-of-Things, network interface controllers (NIC), media access control address (MAC address), and physical unclonable function (PUF).

It is to be understood that aspects of the present invention will be described in terms of a given illustrative architecture; however, other architectures, structures, substrate materials and process features and steps can be varied within the scope of aspects of the present invention.

Figure 1:
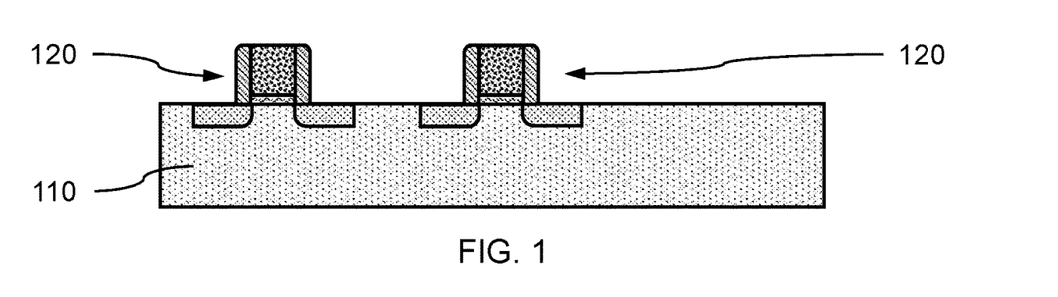
FIG. 1 is a cross-sectional side view showing a plurality of devices on a substrate, in accordance with an embodiment of the present invention.

Referring now to the drawings in which like numerals represent the same or similar elements and initially to FIG. 1, a cross-sectional side view showing a plurality of devices on a substrate is shown, in accordance with an embodiment of the present invention In one or more embodiments, a plurality of devices 120 can be formed on a substrate 110, where the substrate 110 can be a semiconductor material, including by not limited to, type IV (e.g., Si, Ge), type IV-IV (e.g., SiC, SiGe), type III-V (e.g., GaAs, GaP, InP, etc.). The substrate can be a semiconductor-on-insulator (SeOI) structure, for example, a silicon-on-insulator (SOI) wafer.

In one or more embodiments, one or more devices 120 can be formed on the substrate 110, where the devices can be formed by a series of fabrication processes. The devices 120 can be active devices, for example, transistors, including, but not limited to fin field effect transistors (FinFETs) and planar field effect transistors, and passive devices, including, but not limited to, resistors, capacitors, and inductors. The devices 120 can be combined to form further devices, for example, complementary metal-oxide-semiconductor (CMOS) devices, logic circuits, and memory cells.

Figure 2:
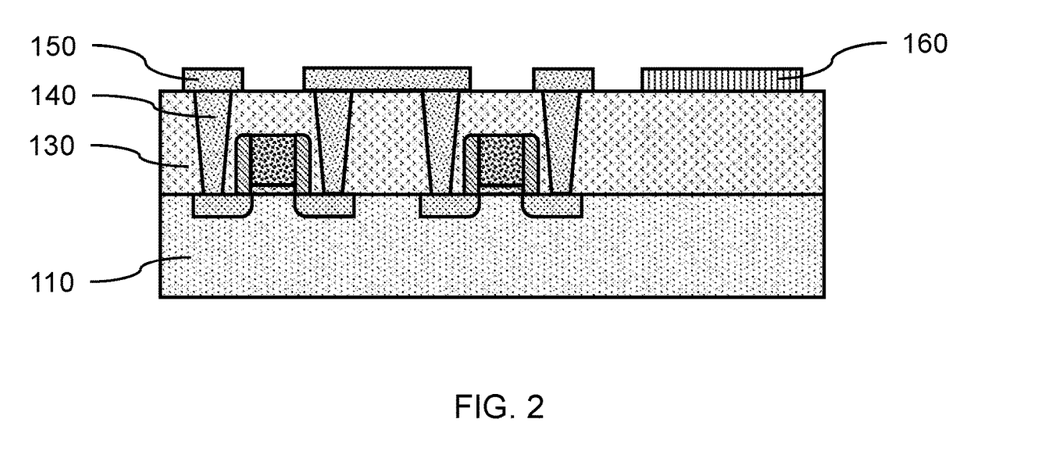
FIG. 2 is a cross-sectional side view showing contacts formed in an interlayer dielectric (ILD) layer and metal lines and a security region formed on the interlayer dielectric (ILD) layer, in accordance with an embodiment of the present invention.

FIG. 2 is a cross-sectional side view showing contacts formed in an interlayer dielectric (ILD) layer and metal lines and a security region formed on the interlayer dielectric (ILD) layer, in accordance with an embodiment of the present invention.

In one or more embodiments, an interlayer dielectric (ILD) layer 130 can be formed over the devices 120 and substrate 110, where the interlayer dielectric (ILD) layer can be a dielectric material formed by a blanket deposition, for example, chemical vapor deposition (CVD) or spin-on coating. In various embodiments, vias and contacts 140 can be formed in the ILD layer 130 to the devices 120, and metal lines 150 of a metallization layer can be formed on or in the ILD layer 130 to the contacts 140.

In one or more embodiments, a security region 160 can be formed on or in the ILD layer 130, where the security region 160 can include a plurality of conductive lines. In various embodiments, the security region 160 can be formed on or in a region of the ILD layer not otherwise occupied by metal lines 150 of the metallization layer. The conductive lines of the security region 160 and the metal lines 150 of the metallization layer can be formed at the same time using the same lithographic and deposition processes.

Figure 3:
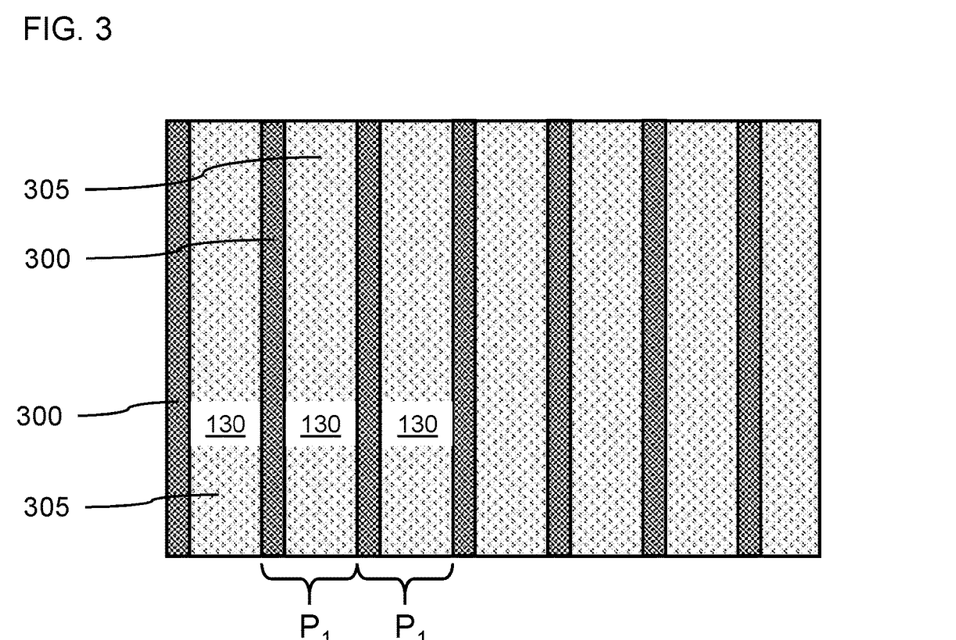
FIG. 3 is a top view showing a plurality of masking lines formed on the ILD layer to create guiding trenches for a first metallization layer, in accordance with an embodiment of the present invention.

FIG. 3 is a top view showing a plurality of masking lines formed on the ILD layer to create guiding trenches for a first metallization layer, in accordance with an embodiment of the present invention.

In one or more embodiments, the metal lines 150 of a metallization layer can be formed at the same time as the conductive lines of the security region 160. In various embodiments, the metal lines 150 of a metallization layer can be produced by forming a plurality of masking lines 300 on the ILD layer 130, where the masking lines 300 can be formed by depositing a hardmask material, softmask material, or combination thereof, and patterning the layer(s) using lithographic techniques and etching/development. The space between adjacent masking lines 300 can form guiding trenches 305, where the ILD layer 130 can be exposed between the masking lines 300, and into which additional material can be deposited, or the exposed surface of the ILD layer chemically patterned.

In various embodiments, the metal lines 150 of a metallization layer can be produced by chemically patterning the ILD layer 130 by exposing the portions of the ILD layer 130 between the masking lines 300 to a chemical species and/or a plasma treatment to alter the surface chemistry of the exposed ILD layer 130.

In various embodiments, the masking lines 300 can have a width in a range of about 10 nm to about 100 nm, or about 20 nm to about 50 nm, and the masking lines 300 can be separated by a pitch, $P_1$, in a range of about 20 nm to about 200 nm, or about 40 nm to about 80 nm, although other masking line widths and pitches are also contemplated.

Figure 4:
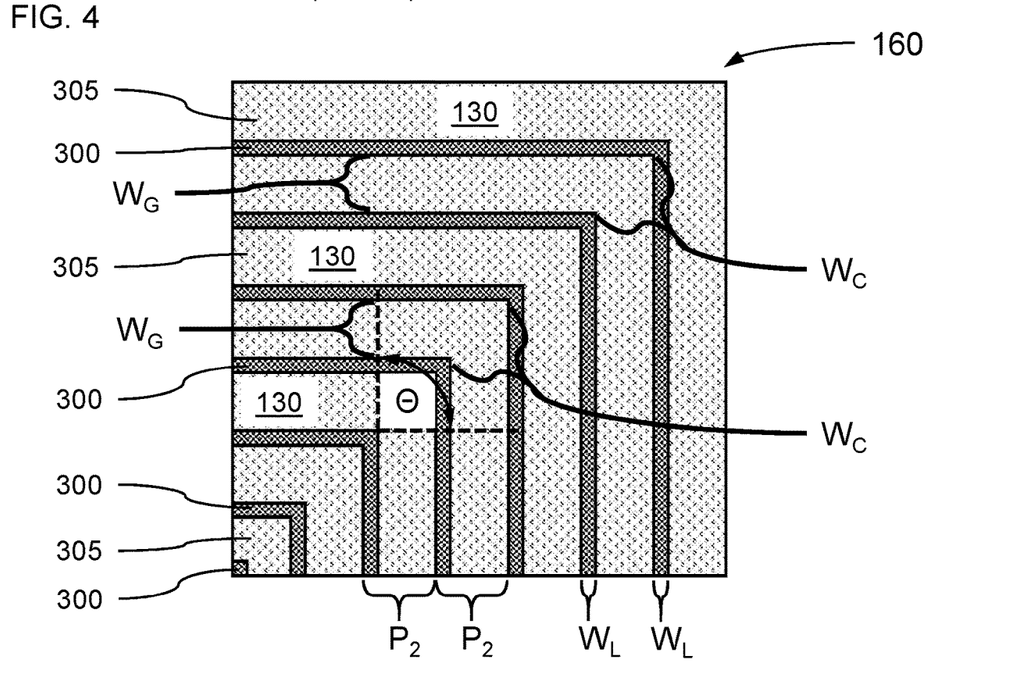
FIG. 4 is a top view showing a plurality of masking lines formed to create guiding trenches for the security region formed on or in the ILD layer, in accordance with an embodiment of the present invention.

FIG. 4 is a top view showing a plurality of masking lines formed to create guiding trenches for the security region formed on or in the ILD layer, in accordance with an embodiment of the present invention.

In one or more embodiments, the conductive lines of a security region 160 can be formed at the same time as the metal lines 150 of the metallization layer by forming a plurality of masking lines 300 on the ILD layer 130, where the masking lines 300 can be formed by depositing a hardmask material, softmask material, or combination thereof, and patterning the layer(s) using lithographic techniques and etching/development. The space between adjacent masking lines 300 can form guiding trenches 305, where the ILD layer 130 can be exposed between the masking lines 300, and into which additional material can be deposited. pitch, $P_2$, In various embodiments, the guiding trenches 305 can have a width, $W_G$, between sidewalls of the masking lines 300 in a range of about 40 nm to about 90 nm, or about 60 nm to about 80 nm, or integer multiple of the natural pitch of the self-assembling materials, although other widths are also contemplated. The masking lines 300 can have a width, $W_L$, in a range of about 15 nm to about 50 nm, or about 30 nm to about 40 nm, although other widths are also contemplated. The width, $W_G$, can be about half (½) the pitch, $P_2$, if a surface chemical contrast is employed to drive the self-assembly. In various embodiments, the masking lines 300 and guiding trenches 305 can include a bend, where the bend in the masking lines 300 forming the guiding trenches 305 can have an angle, Θ. In various embodiments, the bend can have an angle, Θ, from 45° to 135°, or from 60° to 120°, or from 85° to 95°, or 90°, although other angles are also contemplated. The bend can form a corner in the guiding trenches 305. In various embodiments, the guiding trenches 305 can have a width, $W_C$, at the corner formed at the bend, where the width, $W_C$, is greater than the width, $W_G$, between sidewalls of the masking lines 300, as calculated from the cosine of half the angle, Θ, and the width, $W_G$.

In various embodiments, the masking lines 300 can have a width in a range of about 10 nm to about 100 nm, or about 20 nm to about 50 nm, and the masking lines 300 can be separated by a pitch, $P_2$, in a range of about 20 nm to about 200 nm, or about 40 nm to about 80 nm, although other masking line widths and pitches are also contemplated. The masking lines 300 in the security region 160 can be the same width as the masking lines for the metallization layer. The masking lines 300 in the security region 160 can include a bend at a predetermined angle, Θ.

Figure 5:
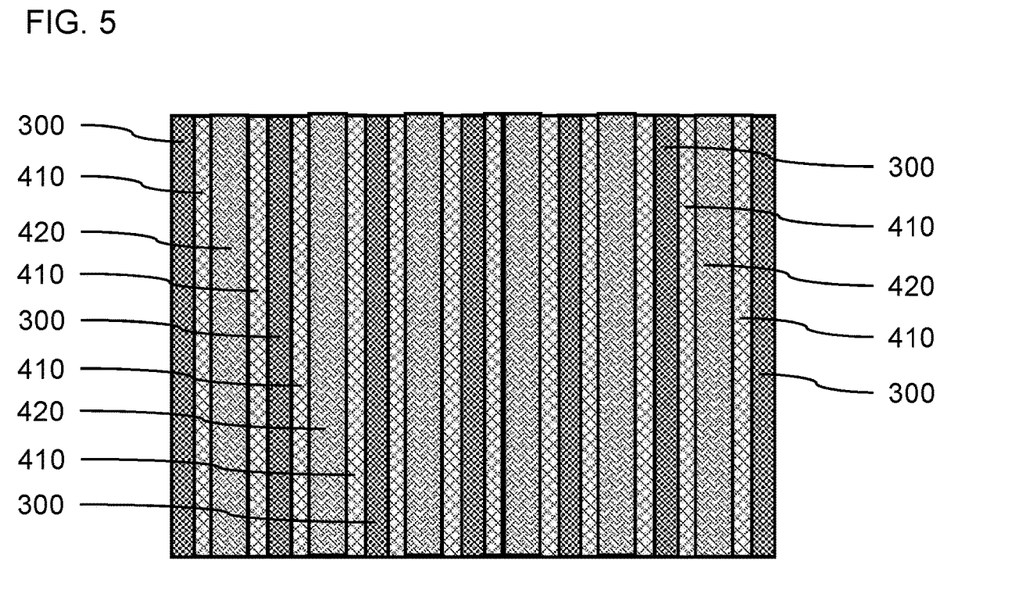
FIG. 5 is a top view showing a directed self-assembly copolymer formed in the guiding trenches for the first metallization layer, in accordance with an embodiment of the present invention.

FIG. 5 is a top view showing a directed self-assembly copolymer formed in the guiding trenches for the first metallization layer, in accordance with an embodiment of the present invention.

In one or more embodiments, a directed self-assembly copolymer can be deposited into the guiding trenches 305 formed by the masking lines 300 on an ILD layer 130, where the directed self-assembly copolymer can be a blend of a block copolymer (BCP) and one or more homopolymers. The homopolymers can each be formed from the same type of monomers as one of the blocks of the BCP. The BCP of the directed self-assembly copolymer can include two or more block components that can phase separate into at least two distinct material regions having different chemical properties. After phase separation, the different distinct material regions formed by the blocks can be continuous in at least one direction, e.g., laminar. In various embodiments, one of the two or more blocks can be in physical contact with a sidewall of each of the masking lines 300, where the monomers forming the polymer block has an affinity for the material of the masking line 300. The same block of the BCP, for example, A, can be on opposite sides of the masking lines 300.

In one or more embodiments, the directed self-assembly copolymer can include a block copolymer of poly styrene (PS) and poly methylmethacrylate (PMMA), where the PS can form a continuous region adjoining a continuous region of PMMA. Other BCPs that can be used include, but are not limited to, polystyrene-block-poly vinyl pyridine (PS-PVP) and polystyrene-block-poly(dimethylsiloxane) (PS-PDMS). In various embodiments, the BCP can be a di-block copolymer (A-B) or a tri-block (A-B-A), for example, PS-b-PMMA or PS-b-PMMA-b-PS.

In various embodiments, the different blocks (e.g., A, B) forming the copolymer can phase separate into different distinct material regions 410, 420 within each of the guiding trenches 305, where the different distinct material regions 410, 420 have different chemical properties. The different distinct material regions 410, 420 can be continuous in at least one direction, such that each of the distinct material regions 410, 420 can form a continuous line along the direction of the guiding trenches 305. A first block, A, of the di-block copolymer can form a first continuous material region 410 adjoining the masking lines 300. The second block, B, of the di-block copolymer can form a second continuous material region 420 adjoining the first distinct material region 410 and running in the same direction. The second material region 420 can be disposed between two first material regions 410. The chemical components of the copolymer can be block chains of different monomers, where the chemical composition of the blocks control the phase separation and affinity for the masking lines 300 and substrate material or ILD layer 130. The arrangement of the first material region 410 and the second material region 420 can result in the second material region 420 having a width twice (i.e., 2×) that of the first material region 410, where the second block, B, of the di-block copolymer extends into the central portion of the guiding trenches 305 from opposite sides, while the first block, A, of the di-block copolymer is against one of the two masking lines 300 forming the guiding trench 305 (|A-B B-A|).

In one or more embodiments, the directed self-assembly copolymer can phase separate due to a heat treatment, for example, a thermal anneal at a temperature greater than the glass transition temperature, Tg, of the higher of the two or more blocks forming the directed self-assembly copolymer, so that the polymer chains are allow to move and rearrange themselves. With sufficient "repulsive" force between the two blocks, the same type of blocks on different chains can stay together to minimize the contact between different types of blocks. After self-assembly, the polymer arrangement in one direction can be . . . A-B B-A A-B B-A . . . , where two A blocks from different chains can form a "continuous line domain" of a first material region 410, and two B blocks from different chains can form a "continuous line domain" of a second material region 420 along the same direction.

Figure 6:
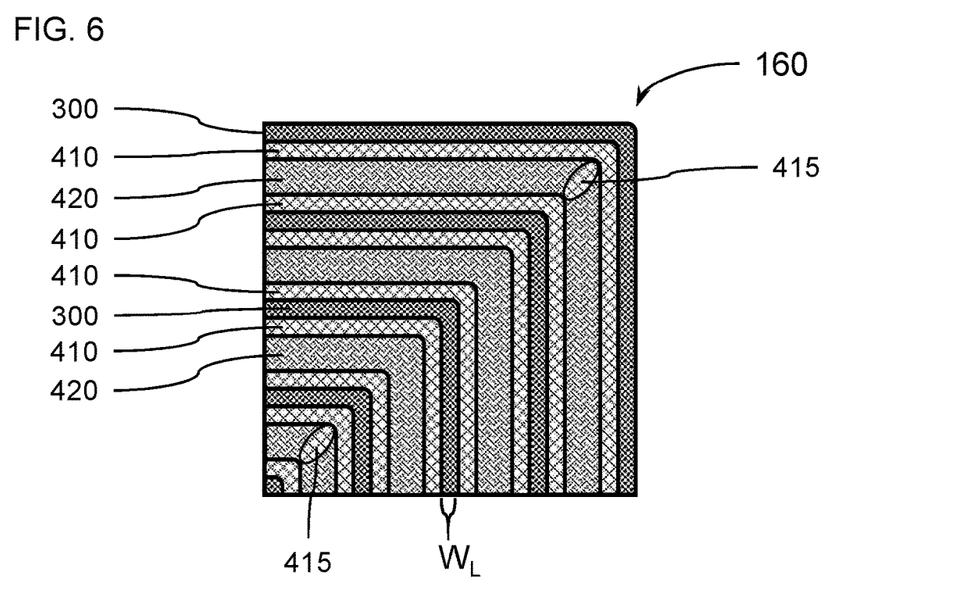
FIG. 6 is a top view showing a directed self-assembly copolymer formed in the guiding trenches for the security region, in accordance with an embodiment of the present invention.

FIG. 6 is a top view showing a directed self-assembly copolymer formed in the guiding trenches for the security region, in accordance with an embodiment of the present invention.

In one or more embodiments, a directed self-assembly copolymer can be deposited in the guiding trenches 305 of the security region 160, where the block copolymers can form at least two distinct material regions 410, 420 and a plug 415 of at least one of the chemical component of the copolymer in the distinct material region 420 of the other chemical component. The plug can form from a homopolymer of one of the at least two different monomer species, a or b, of the BCP, where the homopolymer can accumulate at the bend forming a plug 415. The plug 415 can form due to a difference in the length, $L_{BCP}$, of the BCP and the width, $W_G$, and, $W_C$, in the guiding trenches 305, where the length, $L_{BCP}$, of the BCP can determine whether the BCP is under a compressive or tensile stress in the guiding trenches 305. For example, the $L_{BCP}$ of the BCP can be in a range of about 15 nm to about 50 nm, and the width, $W_G$, can be in a range of about 15 nm to about 50 nm, where $L_{BCP}$ is different from $W_G$. The ratio of the length, $L_{BCP}$, to the width, $W_G$, and the width, $W_C$, can determine if the BCP is under tensile or compressive stress. Compression of the lamellae material regions 410, 420 can form bridges across the different material region 410, 420 along straight sections of the guiding trenches 305. At the corners, the change in the width, $W_G$, to $W_C$, can cause alter the tensile/compressive stress in the lamellae material regions 410 from the tensile/compressive stress in the straight sections, which form plugs 415 at the corners. The plugs can form randomly at the corners of different guiding trenches 305.

In various embodiments, a plug 415 of one of the at least two components can form in a portion of the other adjoining distinct material region 420 of the other component. The plug 415 can form at the bend in the guiding trenches, where the length of the directed self-assembly copolymer, the change in the width of the guiding trenches 305, and the angle of the bend can control the ratio of the number of guiding trenches 305 forming a plug 415 to the number of guiding trenches 305 in which a plug 415 does not form. The plug 415 can form randomly at the bend in the guiding trenches 305, so the special arrangement of plugs 415 and resulting discontinuous material regions 420 would have a statistical likelihood, but the exact placements would be unknown during the process. A sufficient number of guiding trenches 305 can be provided to avoid duplication of the arrangement of plugs 415 through statistical chance.

Figure 7:
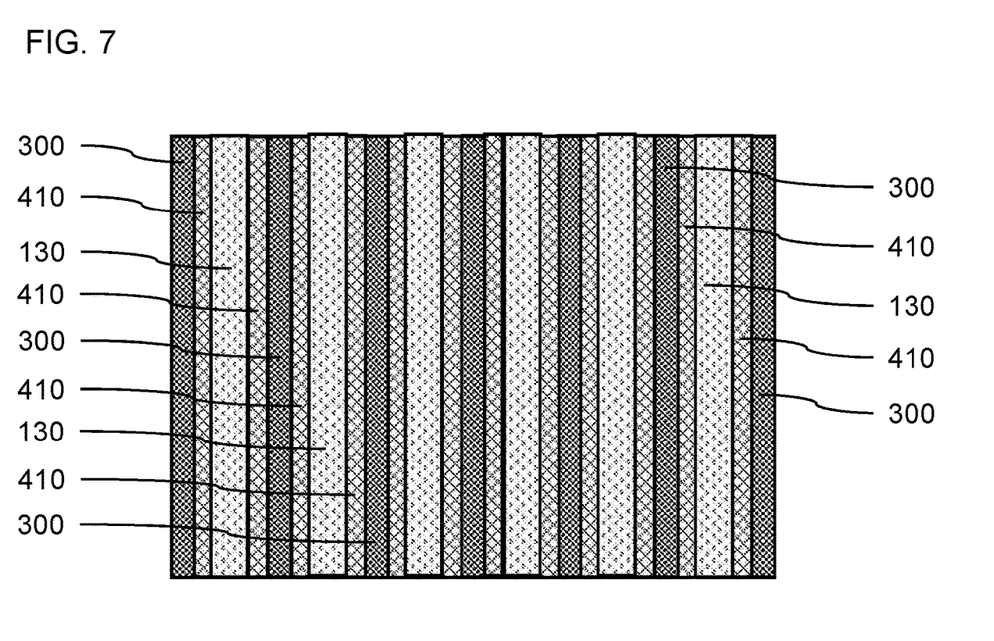
FIG. 7 is a top view showing a component of the directed self-assembly copolymer removed to form etching channels above the ILD layer, in accordance with an embodiment of the present invention.

FIG. 7 is a top view showing a component of the directed self-assembly copolymer removed to form etching channels above the ILD layer, in accordance with an embodiment of the present invention.

In one or more embodiments, the chemical component forming the distinct material region 420 can be removed using a selective chemical etch, for example, a wet chemical etch, to form etching channels above the ILD layer 130. A plug 415 may not be formed in the straight portion of the guiding trenches 305 by maintain the length, $L_{BCP}$, of the BCP comparable to the width, $W_G$, so the BCP is not under excessive compressive or tensile stress.

Figure 8:
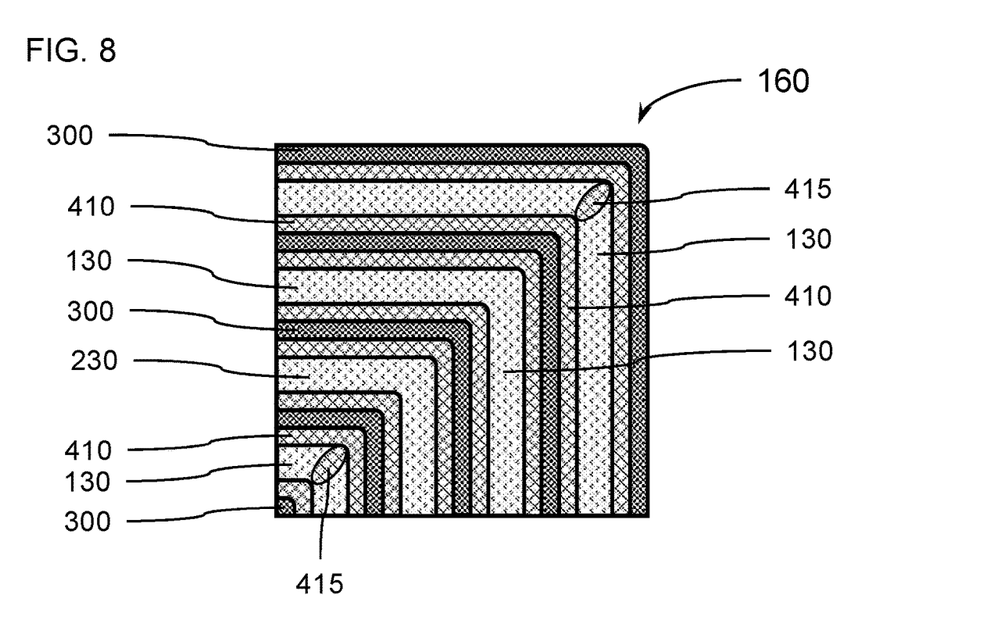
FIG. 8 is a top view showing a component of the directed self-assembly copolymer removed to form etching channels above the ILD layer for the security region, in accordance with an embodiment of the present invention.

FIG. 8 is a top view showing a component of the directed self-assembly copolymer removed to form etching channels above the ILD layer for the security region, in accordance with an embodiment of the present invention.

In one or more embodiments, the chemical component forming the distinct material region 420 can be removed using a selective chemical etch, for example, a wet chemical etch, to form etching channels 450 above the ILD layer 130. The plug material of the other chemical component can remain in the etching channels 450 after removal of the distinct material region 420.

In various embodiments, the etching channels 450 can have a width in a range of about 30 nm to about 100 nm, or about 60 nm to about 100 nm, or about 65 nm to about 80 nm, or about 75 nm to about 85 nm, although other widths are also contemplated. The widths of the etching channels 450 can depend on the lengths of the different blocks in the BCP and the amount of compressive and tensile strain in the BCP in the guiding trenches 305, where the arrangement (e.g., |A-B B-A|) can form the region 420 with about twice (i.e., 2×) the width as the B block length.

Figure 9:
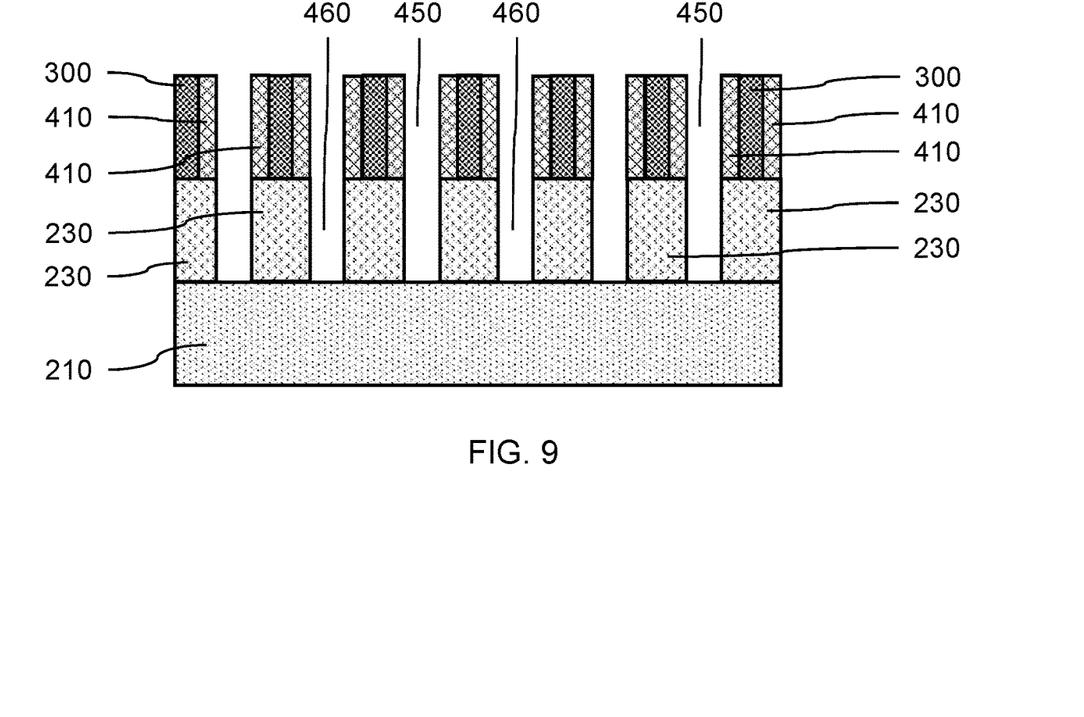
FIG. 9 is a cross-sectional side view showing metallization channels formed in the ILD layer, in accordance with an embodiment of the present invention.

FIG. 9 is a cross-sectional side view showing metallization channels formed in the ILD layer, in accordance with an embodiment of the present invention.

In one or more embodiments, the masking layer 300 and distinct material region 410 can form an etching mask over the ILD layer 130. The portion of the ILD layer exposed by removing distinct material region 420 to form etching channels 450 can be etched using a directional etch, for example, a reactive ion etch (RIE) to form metallization channels 460.

Figure 10:
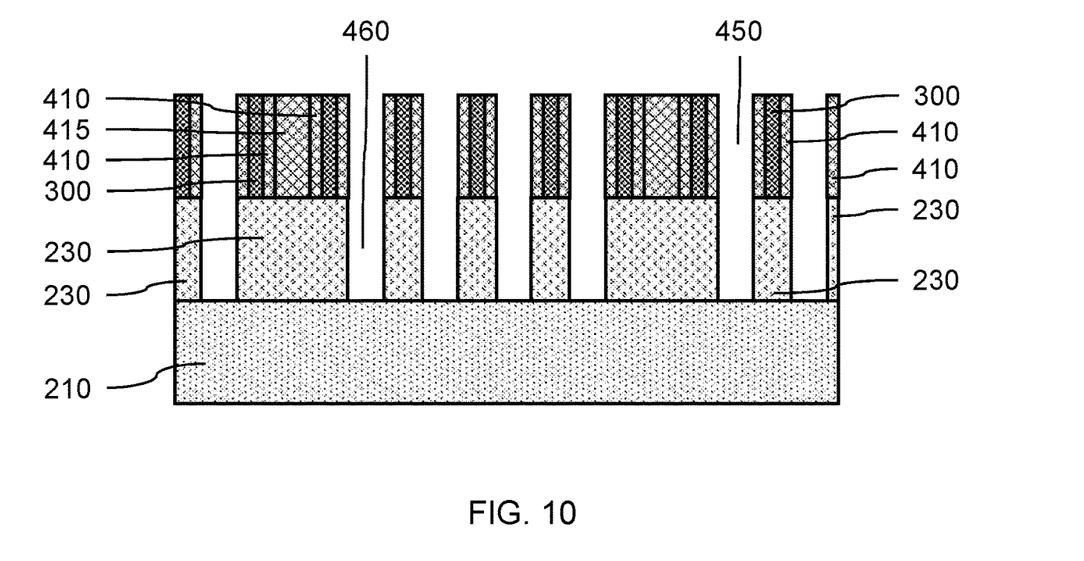
FIG. 10 is a cross-sectional side view showing metallization channels formed in the ILD layer along the corners of the security region, in accordance with an embodiment of the present invention.

FIG. 10 is a cross-sectional side view showing metallization channels formed in the ILD layer along the corners of the security region, in accordance with an embodiment of the present invention.

In one or more embodiments, the masking layer 300 and distinct material region 410 can form an etching mask over the ILD layer 130. The portion of the ILD layer exposed by removing distinct material region 420 can be etched using a directional etch (e.g., RIE). The plug(s) 415 remaining at the corners in a plurality of the etching channels can mask the underlying dielectric material of the ILD layer 130. A portion of the electrically insulating dielectric ILD layer 130 remains beneath each of the remaining plugs, so the metallization channel 460 formed in the ILD layer 130 is not physically continuous.

Figure 11:
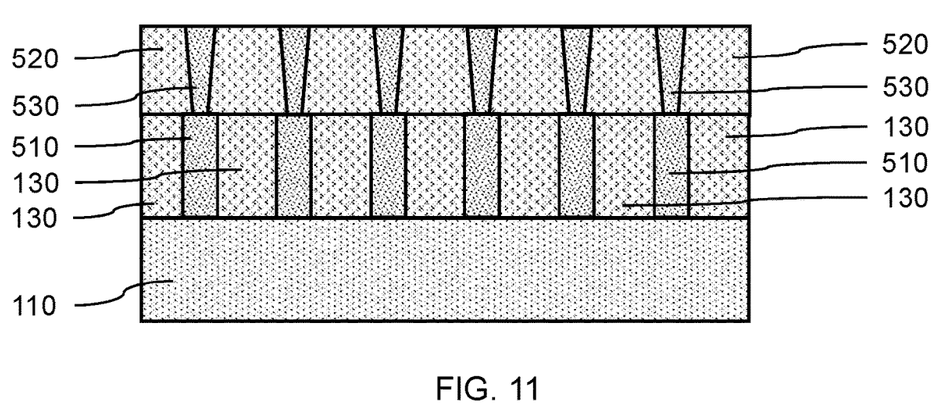
FIG. 11 is a cross-sectional side view showing vias formed in a second ILD layer to the conductive lines of the metallization layer, in accordance with an embodiment of the present invention.

FIG. 11 is a cross-sectional side view showing vias formed in a second ILD layer to the conductive lines of the metallization layer, in accordance with an embodiment of the present invention.

In one or more embodiments, the masking layer 300 and distinct material region 420 can be removed to expose the underlying ILD layer 130 with the metallization channels. In various embodiments, a conductive material can be formed in the metallization channels, where the conductive material forms continuous conductive lines 510 in the straight metallization channels. The conductive lines 510 can be parallel before and after a bend. Since a portion of the electrically insulating dielectric ILD layer 130 remains in a section of a plurality of the metallization channels 460, the conductive lines 510 formed in these metallization channels 460 are not physically or electrically continuous. The randomly placed plugs 415, thereby, cause the conductive material in random metallization channels 460 to be discontinuous.

In various embodiments, each of the parallel conductive lines has a width in a range of about 30 nm to about 100 nm, or about 60 nm to about 100 nm, or about 65 nm to about 80 nm, or about 75 nm to about 85 nm, although other widths are also contemplated. The widths of the conductive lines can depend on the lengths of the different blocks in the BCP and the amount of compressive and tensile strain in the BCP in the guiding trenches 305, where the arrangement (e.g., |A-B B-A|) can form a region 420 of about twice (i.e., 2×) the width of the block length.

In one or more embodiments, a second ILD layer 520 can be formed on the conductive lines 510 and first ILD layer 130, and vias 530 can be formed in the second ILD layer 520 to the conductive lines 510.

Figure 12:
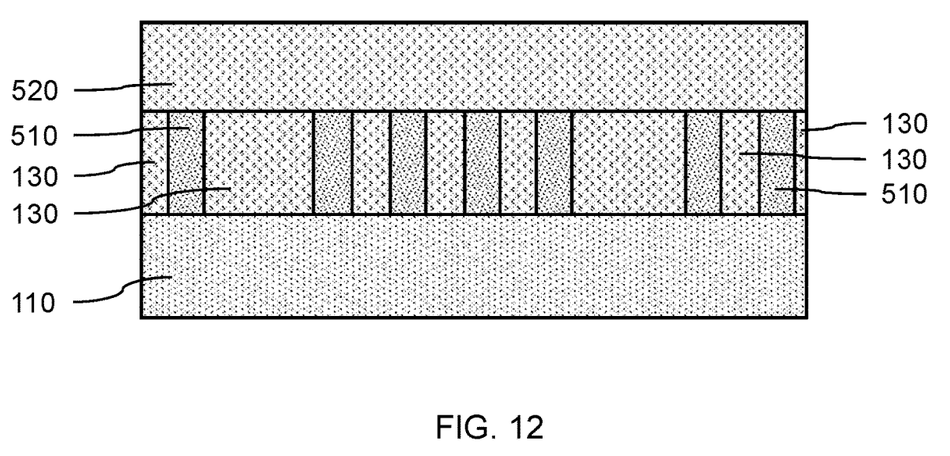
FIG. 12 is a cross-sectional side view showing conductive lines formed in the ILD layer at the corners of the security region, in accordance with an embodiment of the present invention.

FIG. 12 is a cross-sectional side view showing conductive lines formed in the ILD layer at the corners of the security region, in accordance with an embodiment of the present invention.

In one or more embodiments, the masking layer 300 and distinct material region 410 can be removed to expose the underlying ILD layer 130 and metallization channels 460. The plugs 415 can be removed with the material region 410, since they are made of the same monomer species. In various embodiments, a conductive material can be formed in the metallization channels, where the conductive material forms discontinuous conductive lines due to the unetched portions of the ILD layer 130 covered by the plug(s) 415 in some of the metallization channels 460 and continuous conductive lines 510 in the other fully etched metallization channels.

Figure 13:
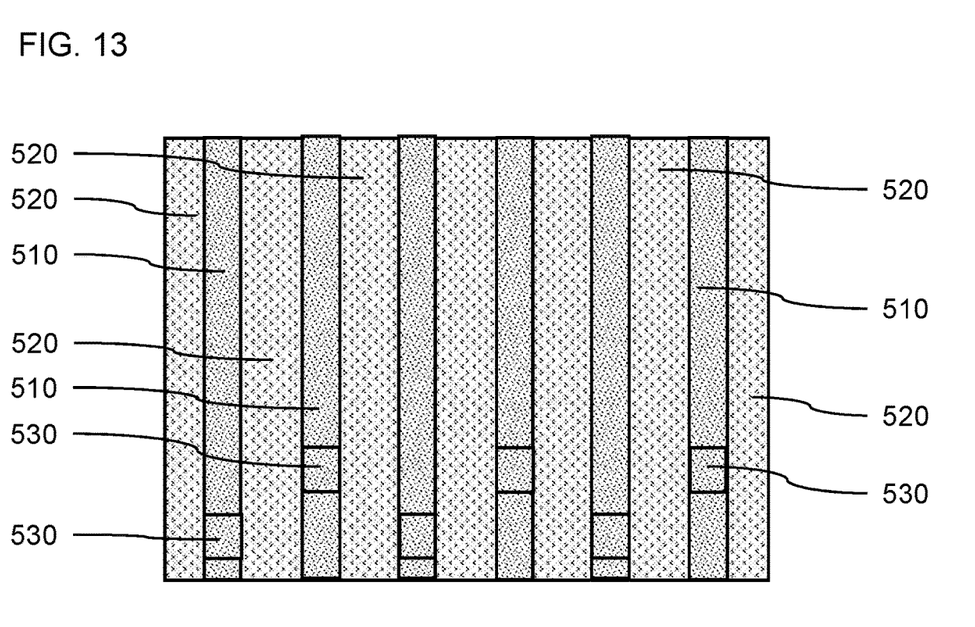
FIG. 13 is a top view showing vias formed above the conductive lines of the metallization layer, in accordance with an embodiment of the present invention.

FIG. 13 is a top view showing vias formed above the conductive lines of the metallization layer, in accordance with an embodiment of the present invention.

In various embodiments, the vias 530 can be staggered, so the vias can form electrical contacts to the conductive lines 510 having a tight pitch.

Figure 14:
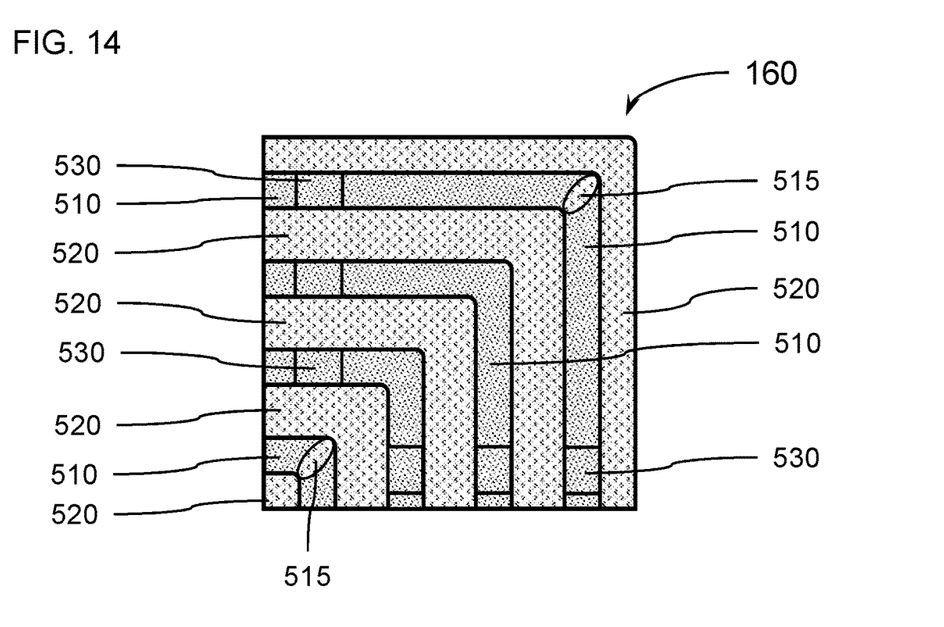
FIG. 14 is a top view showing vias formed above the conductive lines of the security region, in accordance with an embodiment of the present invention.

FIG. 14 is a top view showing vias formed above the conductive lines of the security region, in accordance with an embodiment of the present invention.

In one or more embodiments, vias 530 can be formed at each of the opposite ends of each of the conductive lines 510, so a voltage applied to one end of each conductive line 510, and a voltage detected at the opposite end of each conductive line 510 to determine if the conductive lines 510 are continuous or discontinuous, resulting in a logical "0" or "1". The discontinuous regions 515 formed by the plugs 415 can prevent the voltage applied at one end of the conductive line 510 being detected at the via 530 at the other end of the conductive line.

Figure 15:
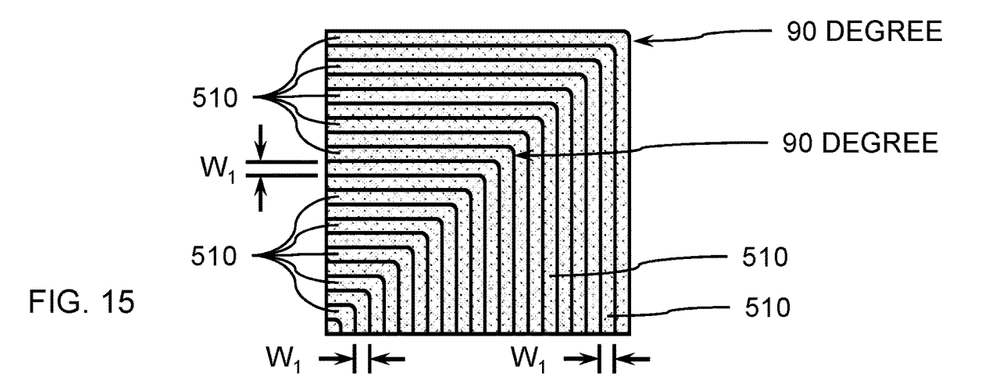
FIG. 15 is a top view showing a plurality of conductive lines with a 90 degree bend and a first predetermined width, in accordance with an embodiment of the present invention.

FIG. 15 is a top view showing a plurality of conductive lines with a 90 degree bend and a first predetermined width, in accordance with an embodiment of the present invention;

In one or more embodiments, a plurality of conductive lines 510 can be formed on a substrate 110, where the conductive lines can be formed by depositing a metal or metal compound in a series of aligned trenches formed on or in the substrate. The plurality of conductive lines 510 can form a security region 160 on or in the ILD layer 130. In various embodiments, each of the plurality of conductive lines 510 can have a bend, where each of the bends can be aligned with the neighboring bends, such that all the conductive lines are parallel on each side of the bends. The conductive lines 510 can be formed in adjacent trenches separated by one or more insulating material(s) to avoid electrical shorting.

In one or more embodiments, a security region 160 can have about 128 conductive lines to about 4096 conductive lines, or about 256 conductive lines to about 2048 conductive lines, or about 512 conductive lines to about 1024 conductive lines, although other quantities of conductive lines are also contemplated. The number, N, of conductive lines 510 can provide $2^N$ different combinations of continuous and discontinuous conductive lines 510. A random number of discontinuous conductive lines can be formed, where the discontinuous conductive lines are randomly arrange in the security region 160 to generate a random security code.

In various embodiments, each of the conductive lines 510 can have a bend with a predetermined angle, Θ. In various embodiments, the bend can be about 90 degrees (90°), where the conductive lines 510 can parallel on each side of the bend, and form a square or rectangular area depending on the lengths and widths of the conductive lines 510.

In various embodiments, the conductive lines 510 can be a metal, including, but not limited to, tungsten (W), cobalt (Co), ruthenium (Ru), copper (Cu), silver (Ag), gold (Au) platinum (Pt), molybdenum (Mo), manganese, (Mn), a metal compound, including, but not limited to, titanium nitride (TiN), titanium carbide (TiC), tantalum nitride (TaN), tantalum carbide (TaC), tungsten nitride (WN), cobaly silicide (CoSi), or a combination thereof.

In one or more embodiments, each of the conductive lines 510 can have a width, $W_1$, where the width is about the same (e.g., within process tolerances). In various embodiments, the width, $W_1$, can be selected based on the number of conductive lines 510 intended to be continuous conductive lines and the number of conductive lines 510 intended to be discontinuous conductive lines. The selected width of the conductive lines 510 can affect the probability that the formation process generates a discontinuity along the path of the conductive line 510, where the discontinuity can be generated at the bend in the conductive lines. The width, $W_1$, of the conductive lines can be the same on both sides of the bend.

In various embodiments, there can be from about 40% to about 60% discontinuous conductive lines, or about 45% to about 55% discontinuous conductive lines, or about 50% discontinuous conductive lines 510.

Figure 16:
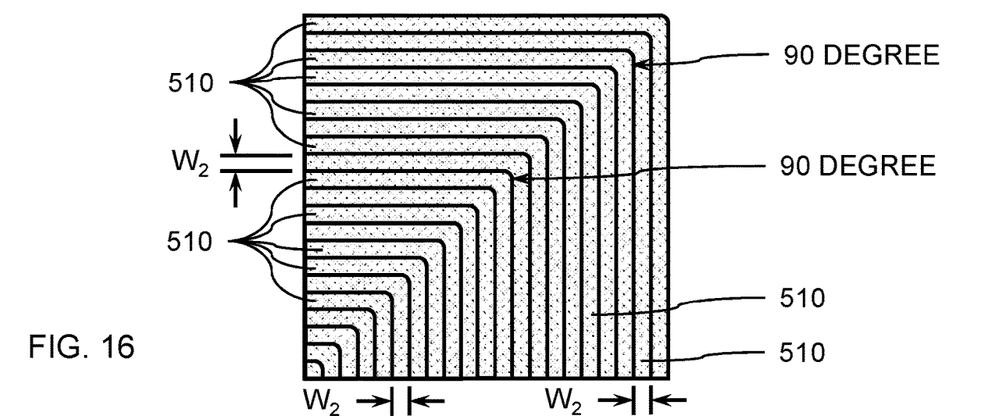
FIG. 16 is a top view showing a plurality of conductive lines with a 90 degree bend and a second predetermined width, in accordance with an embodiment of the present invention.

FIG. 16 is a top view showing a plurality of conductive lines 510 with a 90 degree bend and a second predetermined width, $W_2$, in accordance with an embodiment of the present invention.

In one or more embodiments, the conductive lines 510 can have a width, $W_2$, greater than width, $W_1$, where the greater width can provide a different number of discontinuous conductive lines 510. In various embodiments, by adjusting the widths of the conductive lines, different ratios of continuous to discontinuous conductive lines 510 can be generated. The width, $W_2$, can be sufficient to randomly generate a ratio of discontinuous conductive lines 510 to continuous conductive lines 510 of about 40:60 to about 60:40, or about 50:50.

Figure 17:
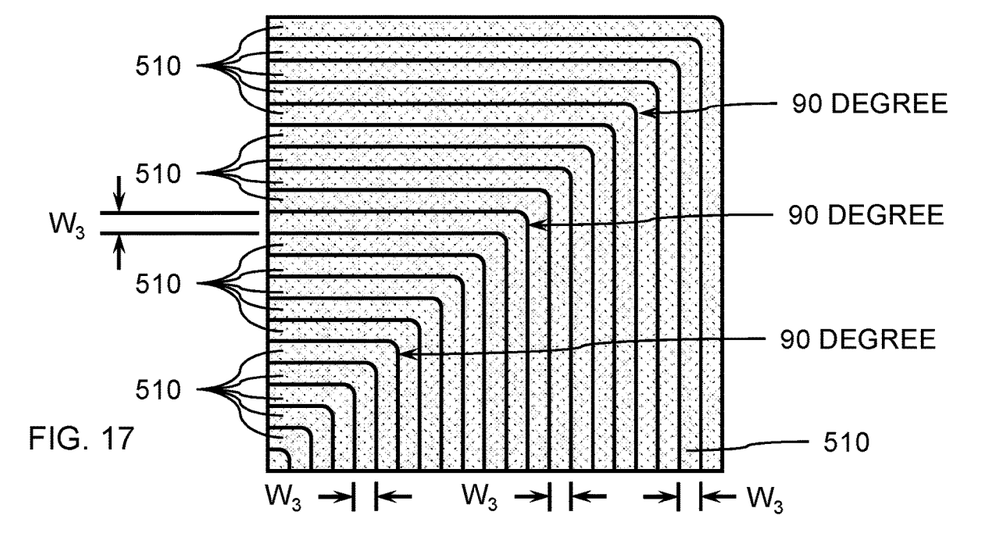
FIG. 17 is a top view showing a plurality of conductive lines with a 90 degree bend and a third predetermined width, in accordance with an embodiment of the present invention.

FIG. 17 is a top view showing a plurality of conductive lines with a 90 degree bend and a third predetermined width, in accordance with an embodiment of the present invention.

In one or more embodiments, the conductive lines 510 can have a width, $W_3$, greater than width, $W_1$, or width, $W_2$, where the greater width can provide another different number of discontinuous conductive lines 510. In various embodiments, by adjusting the widths of the conductive lines, the ratio of discontinuous conductive lines 510 to continuous conductive lines 510 can be greater than 50:50. The ratio of discontinuous conductive lines 510 to continuous conductive lines 510 can be about 70:30 or about 80:20, or about 90:10.

In various embodiments, the farther the ratio of discontinuous conductive lines 510 to continuous conductive lines 510 from 50:50, the smaller the number of unique identification codes the random process can generate. A ratio of discontinuous conductive lines 510 to continuous conductive lines 510 of 50:50 may be used to provide the most secure range of random identification numbers with the least likelihood of generating duplicate security codes.

Figure 18:
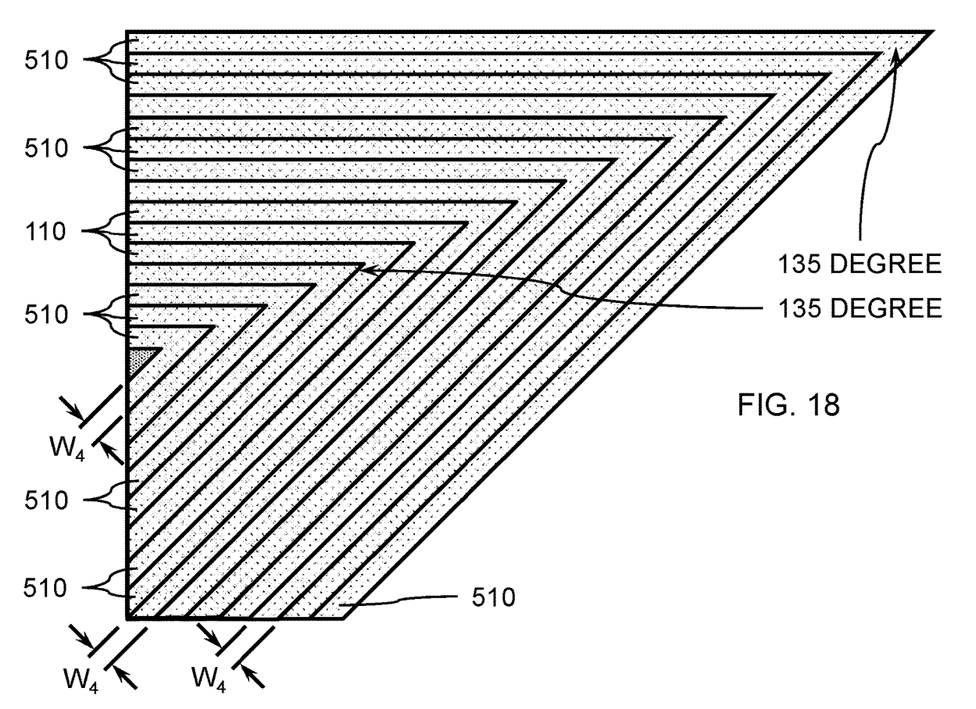
FIG. 18 is a top view showing a plurality of conductive lines with a 135 degree bend and a fourth predetermined width, in accordance with an embodiment of the present invention.

FIG. 18 is a top view showing a plurality of conductive lines with a 135 degree bend and a fourth predetermined width, in accordance with an embodiment of the present invention.

In one or more embodiments, the angle of the bend in the conductive lines 510 can be varied in a range of about 45 degrees to about 135 degrees between the initial direction of the conductive lines 510 before the bend to the direction of the conductive lines 510 after the bend. In various embodiments, the angle of the bend in the conductive lines can affect the probability that the formation process generates a discontinuity along the path of the conductive line 110, where the discontinuity can be generated at the bend in the conductive lines. In various embodiments, a large angle (i.e., greater than 90 degrees) can result in a greater number of discontinuous conductive lines 510, whereas a smaller angle (i.e., less than 90 degrees) can result in fewer discontinuous conductive lines.

Figure 19:
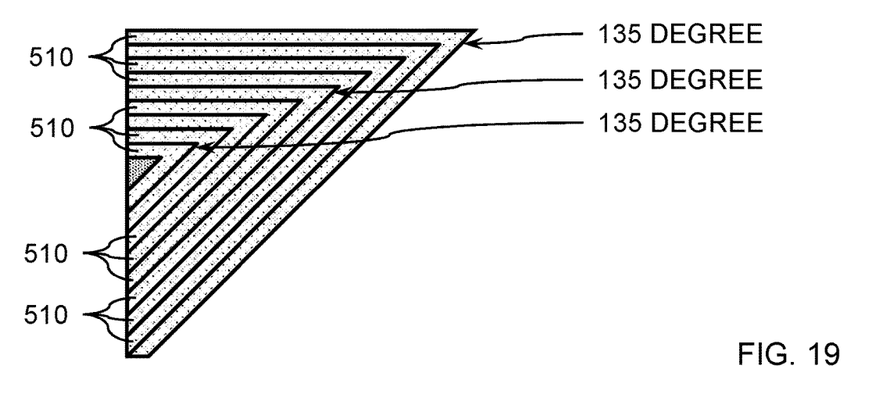
FIG. 19 is a top view showing a plurality of conductive lines with a 135 degree bend and a fifth predetermined width, in accordance with an embodiment of the present invention.

FIG. 19 is a top view showing a plurality of conductive lines with a 135 degree bend and a fifth predetermined width, in accordance with an embodiment of the present invention.

In one or more embodiments, the widths of the conductive lines 510 and the bend angle of the conductive lines can be adjusted to provide a predetermined ratio of discontinuous conductive lines to continuous conductive lines.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments and is not intended to be limiting of example embodiments. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not, preclude the presence or addition of one or more other features, integers, steps, operations, elements, components and/or groups thereof.

Spatially relative terms, such as "beneath," "below," "lower", " " "above," "upper," and the like, can be used herein for ease of description to describe one element's or feature's relationship to another element(s) or features) as illustrated in the FIGS. It will be understood that the spatially relative terms are intended to encompass different orientations of the device in u e or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer referred to as being "between" two layers, it can be the only layer between the two layers intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A security region, comprising:
   a plurality of parallel conductive lines on a substrate, wherein each of the parallel conductive lines has a width and includes a bend, and wherein at least a portion of the plurality of parallel conductive lines is discontinuous at the bend; and
   an electrically insulating material between each adjacent pair of parallel conductive lines, wherein the plurality of parallel conductive lines produces a unique physical and electronic fingerprint that is configured to generate a random electronic code.

2. The security region of claim 1, wherein the plurality of parallel conductive lines includes at least 256 conductive lines.

3. The security region of claim 2, wherein the plurality of parallel conductive lines includes from 512 to 2048 conductive lines.

4. The security region of claim 1, wherein the plurality of parallel conductive lines each has a width in a range of about 60 nanometers (nm) to about 100 nm.

5. The security region of claim 4, wherein the plurality of parallel conductive lines each have a width in a range of about 75 nanometers (nm) to about 85 nm.

6. The security region of claim 4, wherein the angle of the bend in each of the plurality of conductive lines is in a range of about 60 degrees to about 135 degrees.

7. The security region of claim 4, wherein the angle of the bend in each of the plurality of conductive lines is about 90 degrees.

8. The security region of claim 1, wherein the electrically insulating material between each adjacent pair of parallel conductive lines includes a portion of a block copolymer.

9. A security region, comprising:
   a plurality of parallel conductive lines on a substrate, wherein each of the parallel conductive lines has a width in a range of about 65 nm to about 80 nm, and includes a bend with an angle in a range of about 60 degrees to about 135 degrees, and wherein at least a portion of the plurality of parallel conductive lines is discontinuous; and
   an electrically insulating material between each adjacent pair of parallel conductive lines, wherein the plurality of parallel conductive lines produces a unique physical and electronic fingerprint that is configured to generate a random electronic code.

10. The security region of claim 9, wherein a ratio of the portion of discontinuous conductive lines to the portion of continuous conductive lines is in a range of about 40:60 to about 60:40.

11. The security region of claim 10, wherein a ratio of the portion of discontinuous conductive lines to the portion of continuous conductive lines is about 50:50.

12. The security region of claim 11, wherein the angle of the bend is about 90 degrees.

13. The security region of claim 9, wherein the discontinuous parallel conductive lines are randomly arranged based on statistical variations to produce the unique physical and electronic fingerprint.

14. The security region of claim 9, wherein the unique physical and electronic fingerprint is an unknown arrangement of continuous and discontinuous parallel conductive lines.

15. The security region of claim 14, wherein the arrangement of continuous and discontinuous parallel conductive lines includes from 512 to 2048 conductive lines.

16. A security region, comprising:
   a plurality of parallel conductive lines on a substrate, wherein each of the parallel conductive lines has a width in a range of about 60 nanometers (nm) to about 100 nm, and includes a bend, and wherein at least a portion of the plurality of parallel conductive lines is discontinuous at the bend; and
   an electrically insulating material between each adjacent pair of parallel conductive lines, wherein the plurality of parallel conductive lines produces a unique physical and electronic fingerprint that is configured to generate a random electronic code.

17. The security region of claim 16, wherein the electrically insulating material between each adjacent pair of parallel conductive lines includes a portion of a block copolymer.

18. The security region of claim 17, wherein the discontinuous parallel conductive lines are randomly arranged based on statistical variations to produce the unique physical and electronic fingerprint.

19. The security region of claim 18, wherein a percentage of the discontinuous parallel conductive lines is based on a ratio of block sizes of a block copolymer (BCP) to the width of the parallel conductive lines due to a mismatch in the block sizes to the widths.

* * * * *